(12) United States Patent
Singh et al.

(10) Patent No.: US 6,972,440 B2
(45) Date of Patent: Dec. 6, 2005

(54) ENHANCED T-GATE STRUCTURE FOR MODULATION DOPED FIELD EFFECT TRANSISTORS

(75) Inventors: Dinkar Singh, White Plains, NY (US); Katherine Lynn Saenger, Ossining, NY (US); Vishnubhai V. Patel, Yorktown Heights, NY (US); Alfred Grill, White Plains, NY (US); Steven John Koester, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 28 days.

(21) Appl. No.: 10/750,697

(22) Filed: Jan. 2, 2004

(65) Prior Publication Data

US 2004/0140506 A1    Jul. 22, 2004

Related U.S. Application Data

(62) Division of application No. 10/207,352, filed on Jul. 29, 2002, now Pat. No. 6,740,535.

(51) Int. Cl.[7] .......................................... H01L 31/0328
(52) U.S. Cl. ...................................... 257/194; 257/280
(58) Field of Search ............................. 257/194, 280, 257/401, 759, 900

(56) References Cited

U.S. PATENT DOCUMENTS

| | | | |
|---|---|---|---|
| 5,290,720 A | 3/1994 | Chen | 438/304 |
| 5,734,185 A * | 3/1998 | Iguchi et al. | 257/336 |
| 5,817,558 A | 10/1998 | Wu | 438/291 |
| 6,159,781 A | 12/2000 | Pan | 438/167 |
| 6,417,084 B1 | 7/2002 | Singh | 438/585 |
| 6,452,229 B1 | 9/2002 | Krivokapic | 257/330 |
| 6,605,831 B1 * | 8/2003 | Inai et al. | 257/194 |
| 6,740,535 B2 * | 5/2004 | Singh et al. | 438/18 |
| 6,822,307 B2 * | 11/2004 | Nihei et al. | 257/473 |

* cited by examiner

*Primary Examiner*—Mark V. Prenty
(74) *Attorney, Agent, or Firm*—George Sai-Halasz; Robert M. Trepp

(57) ABSTRACT

A structure and a method are disclosed of an enhanced T-gate for modulation doped field effect transistors (MOD-FETs). The enhanced T-gate has insulator spacer layers sandwiching the neck portion of the T-gate. The spacer layers are thinner than the T-bar portion overhang. The insulating layer provides mechanical support and protects the vulnerable neck portion of the T-gate from chemical attack during subsequent device processing, making the T-gate structure highly scalable and improving yield. The use of thin conformal low dielectric constant insulating layers ensures a low parasitic gate capacitance, and reduces the risk of shorting gate and source metallurgy when source-to-gate spacings are reduced to smaller dimensions.

10 Claims, 5 Drawing Sheets

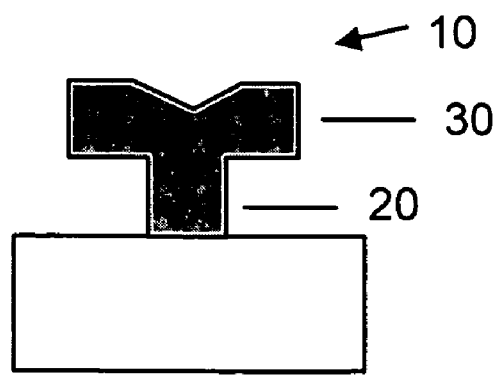
FIG 1
PRIOR ART
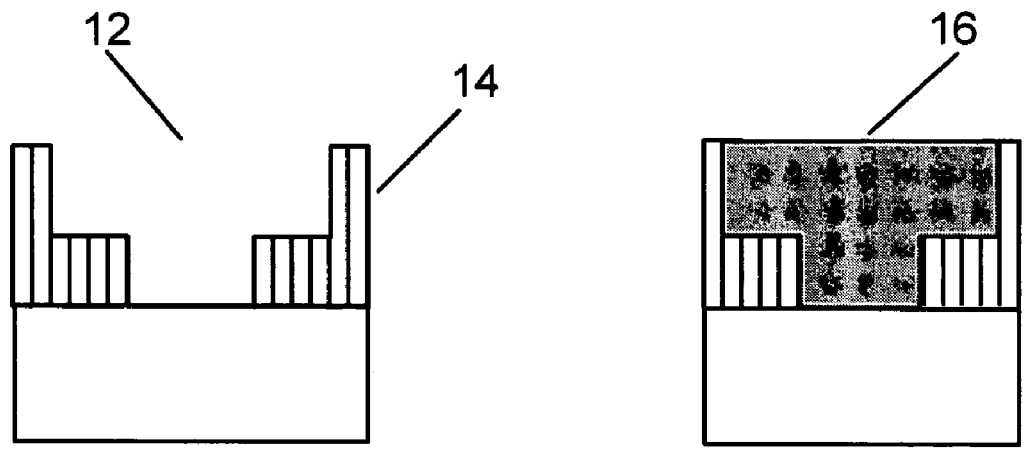
FIG 2A
PRIOR ART
FIG 2B
PRIOR ART
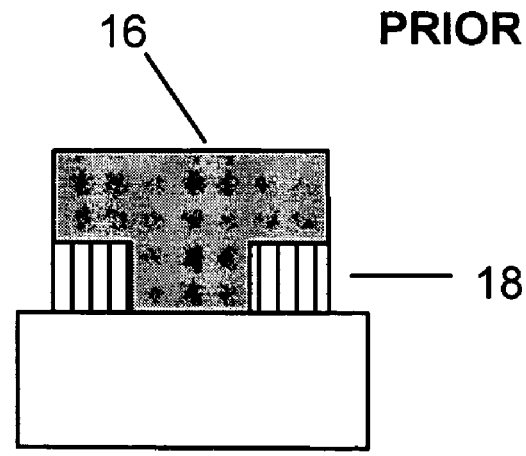
FIG 2C
PRIOR ART

US 6,972,440 B2

ENHANCED T-GATE STRUCTURE FOR MODULATION DOPED FIELD EFFECT TRANSISTORS

This application is a division of application Ser. No. 10/207,352, filed Jul. 29, 2002, now U.S. Pat. No. 6,740,535.

GOVERNMENT SUPPORT

This invention was made with Government support under contract: N66001-99-C-6000, awarded by the Department of the Navy. The Government has certain rights in this invention.

FIELD OF THE INVENTION

The present invention relates to semiconductor devices and more specifically to modulation doped field effect transistors (MODFETs) having a conductive T-shaped gate. A structure and method are disclosed which allow for higher device performance and better T-gate scalability.

BACKGROUND OF THE INVENTION

Today's integrated circuits include a vast number of transistor devices formed in a variety of semiconductor materials. Smaller devices are the key to enhanced performance and to increased reliability. As devices are scaled down, however, the technology becomes more complex and new methods are needed to maintain the expected performance enhancement from one generation of devices to the next.

Modulation doped field effect transistors (MODFETs) hold promise for high frequency, low noise applications [see, for example, S. J. Koester et al., "SiGe p-MODFETs on silicon-on-sapphire substrates with 116 GHz fmax," IEEE Electron Device Letters 22 92 (2001)]. State-of-the-art MODFETs typically increase device speed (often characterized in terms of the unity gain frequency $f_t$) by shrinking the gate length to reduce carrier transit times. However, shrinking the gate dimensions also increases the gate resistance, $R_G$, adversely affecting several aspects of device performance.

The requirement for a low gate resistance has led to the development of T-gates, such as T-gate 10 shown in FIG. 1, which, for a given gate length, reduce the values of $R_G$ [see, for example, U. K. Mishra et al., "Novel high performance self-aligned 0.1-mm long T-gate AlInAs-GaInAs HEMT," IEDM Tech. Dig. 180 (1988)]. As its name suggests, the T-gate comprises a narrow neck portion (20 in FIG. 1) that defines the gate length, and a wider top portion, or T-bar, (30 in FIG. 1) that provides the bulk of the gate conductivity. The T-gate 10 in FIG. 1 is a freestanding T-gate, namely it stands on a surface without any additional support. For brevity from hereon such a freestanding T-gate structure is referred to as a free T-gate.

In order to maintain a low $R_G$, it is desirable to shrink only the neck portion of the T-gate while retaining a wide, upper T-bar portion. However, the top-heavy geometry of the free T-gate gives these structures an inherent mechanical instability, resulting in poor yield. In addition, the neck portion of the T-gate is also extremely vulnerable to chemical attack during subsequent processing. These yield issues, aggravated by shrinking gate lengths, impose severe limitations on the ultimate scalability and applicability of free T-gate structures for MODFET circuits. The yield problem associated with T-gates is highlighted by the fact that even though individual SiGe MODFET devices with excellent characteristics have been fabricated, there have been few demonstrations of circuits fabricated using these devices.

Some prior art T-gate schemes encapsulate a free T-gate neck in dielectric supports. FIGS. 2A–2C illustrate such a scheme. In U.S. Pat. No. 6,159,781 to Y. Pan et al., entitled "Way to fabricate the self-aligned T-shape gate to reduce gate resistivity," incorporated herein by reference, describes a T-shaped opening, 12 in FIG. 2A, formed in dielectric layer 14 to form the structure of FIG. 2A. Opening 12 is filled with conductive gate material 16, to form the structure of FIG. 2B. Then dielectric layer 14 is etched back, using the T-bar portion of the gate as a mask, to form the structure of FIG. 2C with dielectric supports 18. However this patent does not teach the present invention.

Dielectric supports with the prior art geometry of FIG. 2C completely fill the volume under the T-bar portion overhang, a potential disadvantage if additional conductive layers are to be deposited, since conductive material may unintentionally accumulate on the exposed edges of the supports and short the source/drain regions (not shown) to the gate. In addition, the dielectric supports of the prior art are all formed from conventional dielectrics such as silicon dioxides, silicon oxynitrides, and silicon nitrides, materials with relatively high dielectric constants (k>3.5). T-gates thus formed have a relatively high-k dielectric completely underfilling the overhang of the free T-gate that results in a considerable increase in the parasitic gate capacitance associated with the fringing fields present in the dielectric surrounding the gate.

The aforementioned parasitic gate capacitance will play an increasingly important role as the gate length is shortened and will result in a significant reduction in maximum frequency of operation. Since MODFETs are primarily targeted for microwave applications any parasitic capacitances must be minimized. Likewise, interconnect RC delays must be minimized by using a low-k dielectric between any interconnect wiring.

Another important parameter affecting MODFET performance is the parasitic source resistance $R_S$. A low value of $R_S$ is essential to improving both the noise performance and the unity power gain frequency $f_{max}$. The T-gate is compatible with the use of a self-aligned process for forming the source/drain contacts which can help minimize $R_S$ by reducing the source-to-gate spacing [see, for example, S. J. Koester et al., "High-frequency noise performance of SiGe p-channel MODFETs," Electronics Letters 36 674 (2000)]. However, the source-to-gate spacing is still limited by the width of the overhang of the T-bar portion of the T-gate. Retaining the benefits of the T-gate while further reducing the source-to-gate spacing is desirable for pushing up the high frequency performance of MODFETs.

It is therefore an object of-this invention to provide an enhanced T-gate structure that (i) can be scaled to shorter gate lengths while maintaining a high yield, (ii) has a low gate parasitic capacitance, and (iii) enables the self-aligned formation of source and drain contacts, preferably with source-to-gate spacing less than the overhang width of the T-bar portion of the T-gate.

It is also an object of this invention to provide a process for fabricating an enhanced T-gate that (i) can be scaled to shorter gate lengths while maintaining a high yield, (ii) has a low gate parasitic capacitance, and (iii) enables the self-aligned formation of source and drain contacts with source-to-gate spacing preferably less than the overhang of the T-bar portion of the T-gate.

It is an additional object of this invention to provide a device structure containing an enhanced T-gate that can be scaled to shorter gate lengths while maintaining high performance and yield.

It is another object of this invention to provide a device structure containing an enhanced T-gate that enables the self-aligned formation of source and drain contacts with source-to-gate spacing preferably less than the overhang of the T-bar portion of the T-gate.

It is a yet another object of this invention to provide a scheme for fabricating circuits using a device structure containing an enhanced T-gate and having low interconnect capacitance.

SUMMARY OF THE INVENTION

In accordance with the objects listed above, the present invention describes an enhanced T-gate structure that has a thin insulating layer with a low dielectric constant disposed on the neck of the T-gate. This insulating layer provides additional mechanical support and protects the vulnerable neck of the T-gate from chemical attack during subsequent device processing, making the T-gate structure highly scalable and improving yield. By using a thin conformal insulating layer with a low dielectric constant it is possible to reduce the parasitic capacitances associated with the fringing fields surrounding the gate. This insulating layer can also make it possible to reduce the source-to-gate spacing because metal can be deposited in a self-aligned manner under the overhang of the T-gate without shorting the source and gate, in contrast to the prior art supported T-gate of FIG. 2.

The thin insulating layer with a low dielectric constant disposed on the neck of the free T-gate is only partially filling up the volume between the T-bar portion overhang and the surface on which the free T-gate is standing. By leaving air-gaps/voids in this volume the parasitic gate capacitance is further reduced.

The present invention also describes more than one related methods for fabricating the enhanced T-gate structure with dielectric sidewall supports. These methods all start with the formation of a free (freestanding) T-gate structure on a substrate, and in all cases a conformal deposition of a low-k (<3.5) insulator follows. In one particular method this insulator is a thin layer over the exposed surfaces of the T-gate and substrate, in alternate embodiments this insulator completely fills the region of space shadowed by the T-bar portion. In one embodiment when this insulator completely fills the region of space shadowed by the T-bar portion the insulator is a positive-tone photosensitive material. In each method an important final step is the anisotropic removal of the deposited insulator using the T-bar portion of the T-gate structure as a mask. In some embodiments of the method further thinning the sidewall spacer supports by a lateral etch may be performed.

BRIEF DESCRIPTION OF THE DRAWINGS

These and other features of the present invention will become apparent from the accompanying detailed description and drawings.

FIG. 1 shows prior art in a cross-sectional view of a free (freestanding) T-gate formed by conventional processing.

FIGS. 2A–2C show schematically the steps for forming a prior art side wall supported T-gate structure.

DETAILED DESCRIPTION OF THE INVENTION

Figure 3A:
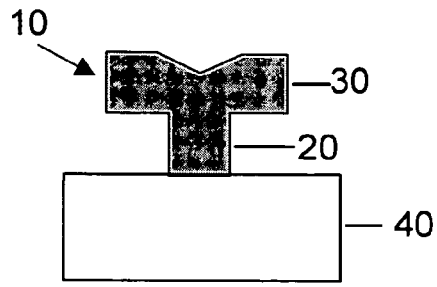
FIGS. 3A–3F show shows schematically the steps for forming enhanced T-gate structures.

FIG. 1 shows prior art in a cross-sectional view of a free (freestanding) T-gate 10 formed by conventional processing. T-gates are typically formed using a stack of metals, e.g. Ti/Pt/Au for state-of-the-art Si/SiGe p-MODFETS, where Ti is used for the gate contact because of its high Schottky barrier on p-type Si. Alternate gate stacks may be used depending on the gate work function desired. For example, the T-bar and neck portions of the T-gate may be formed from any conductive material, including metals (for example Al, Au, Co, Ir, Mo, Nb, Ni, Pd, Pt, re, Ru, Ti, Ta, and W), conductive nitrides and silicides; layers of these materials, combinations of these materials. The T-gate has a neck portion 20, which rests on the surface that the whole T-gate is standing on. The neck portion is topped by the T-bar portion 30. The T-bar portion has overhangs which extend beyond the neck portion by a certain width. There is an empty volume under the overhang, bounded on three sides by the bottom surface of the overhang, the neck-portion, and the surface on which the T-gate is standing.

FIG. 2 shows schematically the steps for forming a prior art sidewall-supported T-gate structure. A T-shaped opening 12 is formed in dielectric layer 14 to form the structure of FIG. 2A, and opening 12 is filled with conductive gate material 16 to form the structure of FIG. 2B. Then dielectric layer 14 is etched back, using the T-bar portion of the gate as a mask, to form the structure of FIG. 2C with dielectric supports 18. The volume underneath the overhang is completely filled up with the dielectric supports 18.

FIG. 3 shows schematically the steps for forming enhanced T-gate structures. FIGS. 3A–3F show the steps of two embodiments of the methods for forming an enhanced T-gate from a free T-gate. Both embodiments start with the formation of a conventional, prior art, free T-gate 10, with neck portion 20 and T-bar portion 30, on substrate 40, as shown in FIGS. 3A. Formation of a free T-gate 10 would typically be accomplished by a lift-off process comprising the steps of forming a 2-tone resist layer on substrate 40, patterning neck and T-bar openings in the resist, depositing the conductive materials of the T-gate by a vertical deposition process, and lifting off the unwanted conductive materials by removing the resist.

In both embodiments, free T-gate structure 10 is conformally coated with a of low-k (low-k means a dielectric constant of under 3.5) insulating material. In one embodiment this is a thick layer as shown 50 on FIG. 3B. Layer 50 is shown as being planarizing, but it may be conformal or intermediate between conformal and planarizing. This layer 50 completely fills the region of space shadowed by the T-bar. In an alternate embodiment of the method the conformal dielectric on the T-gate is a thin layer of low-k insulating material 80, as shown in FIG. 3E. For both embodiments the next step is anisotropically removing the insulator by using the T-bar portion as mask.

Figure 3B:
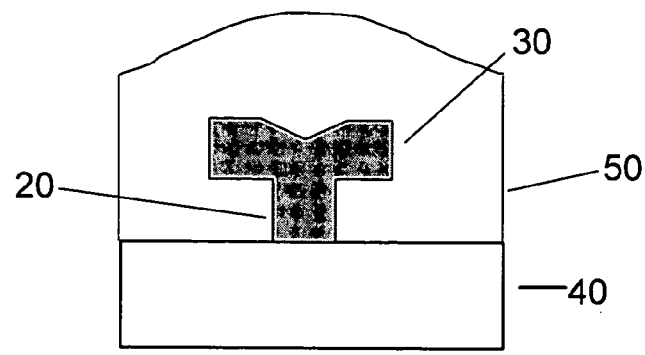
Figure 3C:
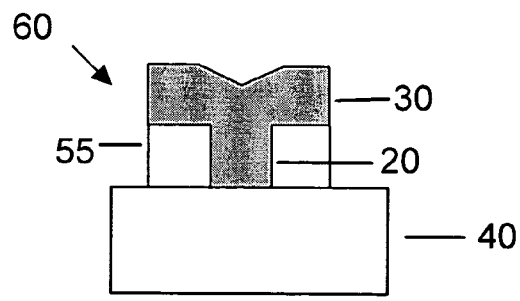
Figure 3D:
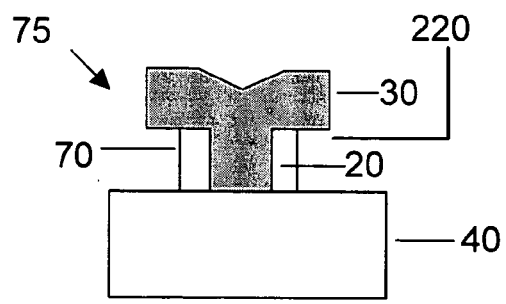
Figure 3E:
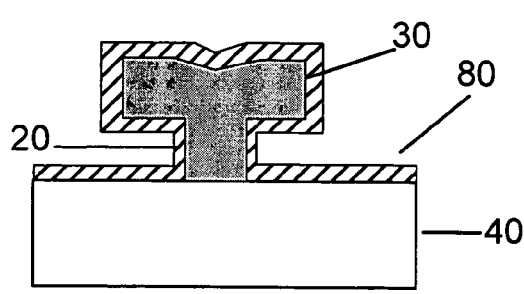

FIG. 3C shows the structure of FIG. 3B after insulator 50 has been anisotropically etched (for example, by reactive ion etching) to leave behind sidewall spacers 55 sandwiching the T-gate neck 20, forming enhanced T-gate 60. The thickness and shape of sidewall spacers 55 can be adjusted by controlling the anisotropy of the etch, as well as the overetch time. FIG. 3D shows the structure of FIG. 3C after a thinning of sidewall spacer supports 55 to form thinned sidewall spacer supports 70 in enhanced T-gate structure 75. The lateral etch may be performed concurrently with or after the anisotropic etch used to form the structure of FIG. 3C. The volume underneath the overhang is only partially filled up with insulator 70 in the enhanced T-gate 75, leaving air-gaps/voids 220 in that certain volume. This void 220 is important for reducing capacitance and in forming self-aligned source/drain metallurgy.

Figure 3F:
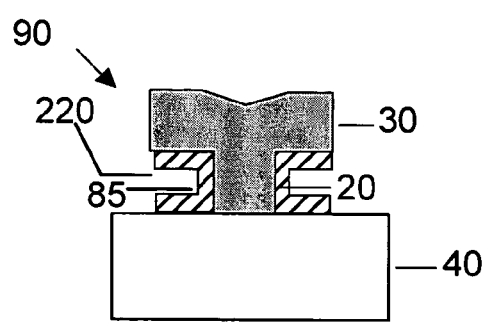

In an alternate embodiment of the method FIG. 3F shows the structure of FIG. 3E after insulating layer 80 has been anisotropically etched (for example, by reactive ion etching) to leave behind sidewall spacers 85 around the neck portion 20, forming enhanced T-gate 90. The insulator 80 under the T-bar overhang has a thickness which is less than half the height of the T-gate neck portion. Accordingly in the enhanced T-gate 90 the insulator has approximately a "C"-shape, as it is attached to the bottom surface of the T-bar portion, the neck portion, and the surface on which the free T-gate is standing. The air-gap/void 220 now is found inside the C-shaped insulator. An advantage of this embodiment of the method is that the dimensions of sidewall spacers 85 are controlled by the thickness and conformality of layer 80, rather than by the timing and anisotropy of the etch.

Sidewall spacers 55, 70 and 85 provide respective enhanced T-gates 60, 75 and 90 with additional mechanical stability and serve to protect the delicate neck portion 20 from chemical attack during processing. Thin conformal low-k spacers with voids also result in low gate parasitic capacitances.

Experiments with exposure to 9:1 buffered oxide etch (BOE), which is a commonly used reagent in Si processing for removing native oxide from Si, of prior art free T-gates and enhanced T-gates show the superior resiliency of the enhanced T-gates. In the case of prior art free T-gates, formed by conventional Ti/Au/Pt metallurgy, after a 20 second dip in BOE a large fraction were no longer attached to the substrate. In contrast the enhanced T-gates of the present invention were all intact even after a 30 second exposure to 9:1 BOE. These enhanced T-gates were formed from the same Ti/Au/Pt metallurgy as the free T-gates, but with sidewall spacers of diamond-like carbon (DLC, also known as amorphous hydrogenated carbon, a-C:H).

While DLC is a preferred material for the sidewall spacer, other insulating materials may be used as well, providing that they have the necessary thermal stability, chemical inertness and low dielectric constant. These insulating materials are preferably selected from the group of low-k (k<3.5) materials comprising amorphous hydrogenated silicon (a-Si:H), SiCO, SiCOH, and SiCH compounds; these silicon-containing materials with some or all of the Si replaced by Ge; insulating inorganic oxides, inorganic polymers; organic polymers such as polyimides or SiLK™ (Trademark of Dow Chemical Co.); fluorinated organic materials, fluorinated amorphous carbon, other carbon-containing materials; hybrid organo-inorganic materials such as spin-on glasses and silsesquioxane-based materials.

These materials may be deposited by any number of deposition techniques, for example, chemical vapor deposition (CVD), plasma-enhanced CVD (PECVD), plasma polymerization, hot-filament-assisted CVD, and high-density-plasma PECVD (HDP-PECVD); sputter deposition, reactive sputter deposition, ion beam deposition; spinning from solution, spraying from solution, dipping, etc.

Figure 4A:
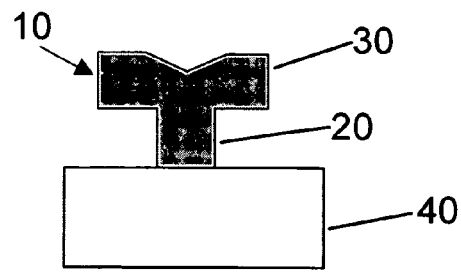
FIGS. 4A–4C show schematically the steps of a further embodiment of the method for forming an enhanced T-gate structure.
Figure 4B:
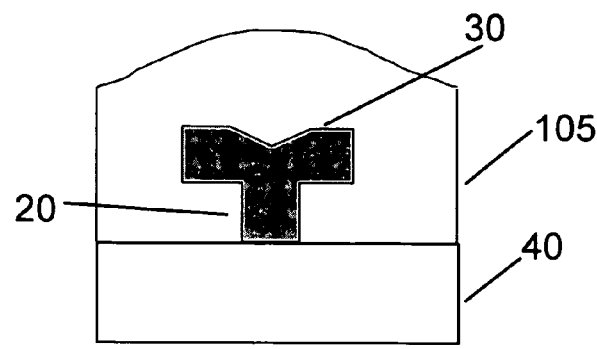
Figure 4C:
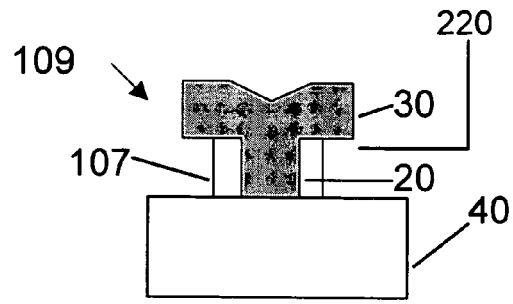

FIG. 4 shows schematically the steps of a further embodiment of the method for forming an enhanced T-gate structure. Conventional, free T-gate 10, with neck portion 20 and T-bar portion 30, is first formed on substrate 40, as shown in FIG. 4A. FIG. 4B shows again, as in the previous embodiments, that the free T-gate structure 10 has been conformally coated with a of low-k insulator. In this embodiment the conformal insulator is a thick layer of a photosensitive insulating material (PIM) 105. PIM layer 105 is shown as being planarizing, but it may be conformal or intermediate between conformal and planarizing. FIG. 4C shows the structure of FIG. 4B after PIM 105 has been anisotropically removed using the T-bar portion as masking element. This embodiment of the method involves some intermediate steps. The PIM layer 105 is blanket-exposed to light of the appropriate wavelength and intensity, and developed to leave behind self-aligned sidewall spacers 107 and enhanced T-gate structure 109. Sidewall spacers 107 are self-aligned because the overhang of the T-bar portion 30 masks the underlying PIM during the blanket exposure. The thickness of sidewall spacers 107 can be adjusted by controlling the exposure dose, as well as the develop time. Sidewall spacers 107 can provide enhanced T-gate 109 with additional mechanical stability and serve to protect delicate neck portion 20 from chemical attack during processing. Air-gaps/voids 220 are left in the volume under the overhang, since the PIM sidewall width is less than the overhang width.

Photosensitive insulating materials for forming the enhanced T-gate of FIGS. 4C should be "positive-tone," i.e., the exposed material is removed during development. Suitable photosensitive insulating materials may be selected from the group comprising photosensitive organic polymers (such as photosensitive polyimides) and photosensitive fluorocarbons (such as amorphous CFx). These materials may be deposited by spinning or spraying from solution, dipping, or any other technique known to the art, such as the deposition techniques listed for sidewall spacers 55, 70, and 85.

The insulating sidewall spacers of enhanced T-gates 75 and 109 also enable the formation of source contacts that are under the T-bar portion, thereby allowing a closer source-to-gate spacing (and lower $R_S$) than is possible with conventional T-gates.

Figure 5A:
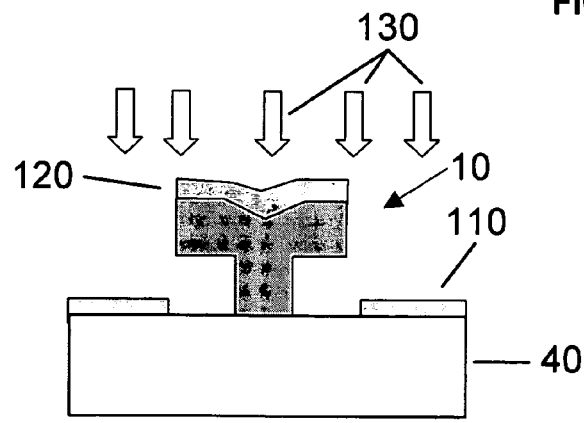
FIGS. 5A–5B show shows schematically the self-aligned source/drain metallurgy steps for a prior art T-gate device, and for the enhanced T-gate device.

FIG. 5 shows schematically the self-aligned source/drain metallurgy steps for a prior art T-gate device, and for the enhanced T-gate device. In a conventional free T-gate, ohmic source and drain contacts are often formed by directly evaporating the metallurgy over the T-gates without any lithography steps. The deposited metal breaks over the T-gate overhang, thereby forming self-aligned source/drain contacts. This is shown in FIG. 5A, where a MODFET with conventional free T-gate 10 has additional source/drain contacts 110 and T-bar portion metal 120 formed by a vertical metal deposition indicated by arrows 130.

Figure 5B:
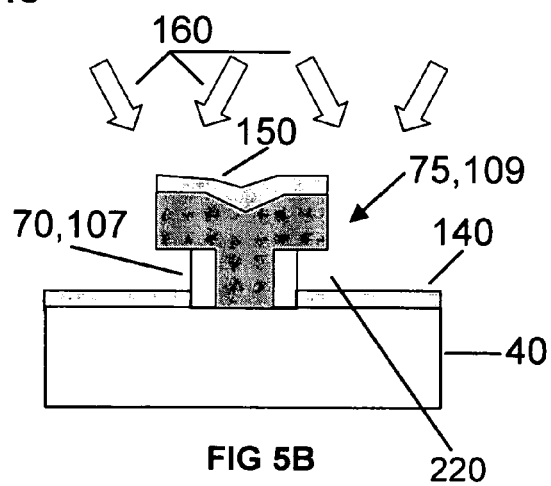

This self-aligned process can be taken one step further with the enhanced T-gate, when directional deposition techniques such as angled evaporation are used. The insulating layer around the neck of the T-gate allows the source-to-gate spacing to be reduced without shorting the source to the gate. This is shown in FIG. 5B, where a MODFET with enhanced T-gate 75 or 109 has source/drain contacts 140 and additional T-bar portion metal 150 formed by an angled metal deposition indicated by arrows 160. Source/drain contacts 140 extend at least partially under the T-bar portion of the T-gate, and their edge is defined by the sidewall spacers 70, 107. If desired, source/drain contact metallurgy 140 may be induced to react with substrate 40 (by a process such as annealing) to form, for example, silicide contacts. Air-gaps/voids 220 are left in the volume under the overhang.

Figure 6A:
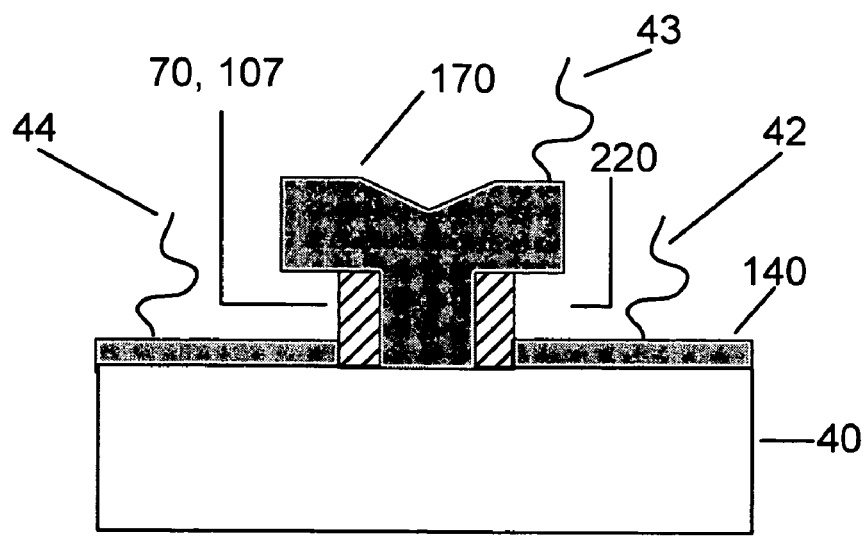
FIGS. 6A–6B show schematically a MODFET devices comprising an enhanced T-gate structure.
Figure 6B:
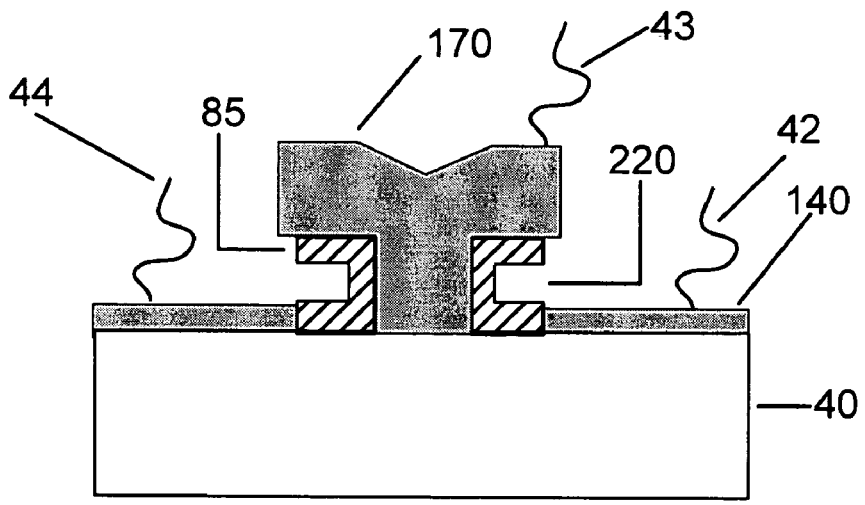

FIG. 6 shows schematically two MODFET devices comprising an enhanced T-gate structure. The MODFET of FIG. 6A has a free T-gate 170 (indicating the combined neck and T-bar portions), with enhancement from sidewall spacers 70 or 107. The enhanced T-gate stands on an appropriately processed substrate 40, with self aligned source/drain metallurgy 140 penetrating nearer to the neck portion than the width of the overhang. The MODFET of FIG. 6B has a free T-gate 170, with enhancement from sidewall spacers 85. The enhanced T-gate stands on an appropriately processed substrate 40, with self aligned source/drain metallurgy 140, with self aligned source/drain metallurgy 140 preferably penetrating nearer to the neck portion than the width of the overhang. Contacts to the devices are shown only symbolically, 42 to the source, 43 to the gate, and 44 to the drain.

Figure 7:
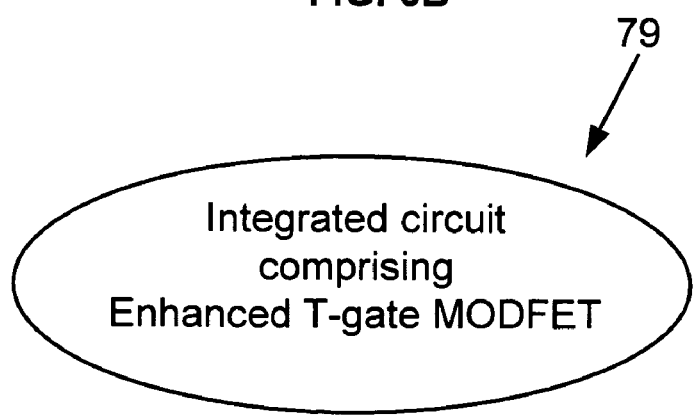
FIG. 7 shows symbolically an integrated circuit comprising a MODFET device which in turn is comprising an enhanced T-gate structure.

FIG. 7 shows symbolically an integrated circuit comprising a MODFET device which in turn is comprising an enhanced T-gate structure. The Integrated circuit 79, for instance, a communication device, comprises at least one MODFET of the kind which has an enhanced T-gate.

Figure 8A:
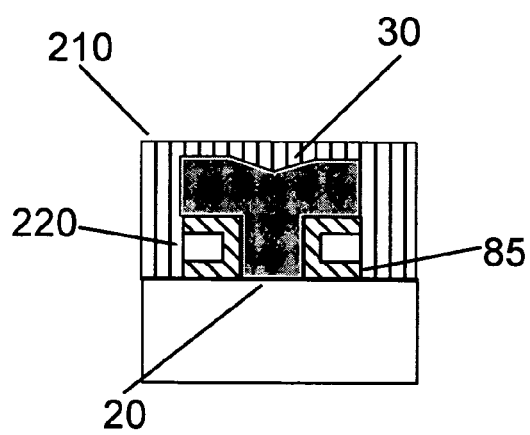
FIGS. 8A–8B show shows the enhanced T-gate structures with voids under the T-bar portion after deposition of a first layer of interconnect dielectric.
Figure 8B:
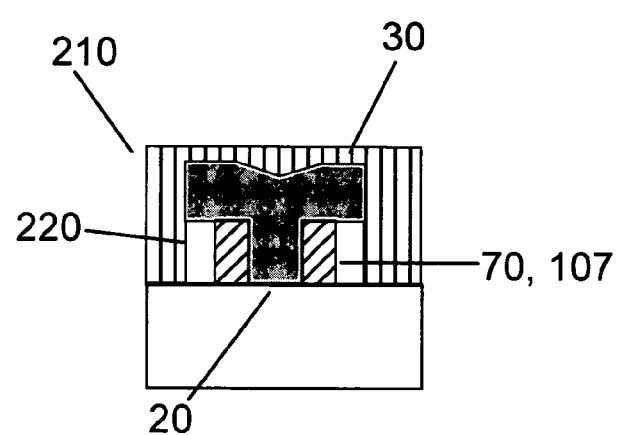

In contrast to the prior art supported T-gate of FIG. 2C, the dielectric neck supports of the present invention are thinner than the width of the T-bar portion overhang, as shown in FIGS. 3D, 3F, and 4C resulting in a reduced gate parasitic capacitance relative to prior art supported T-gates in which the region of space shadowed by the T-bar portion is completely filled with dielectric. FIG. 8 shows the enhanced T-gate structures with voids under the T-bar portion after deposition of a first layer of interconnect dielectric. As indicated in FIGS. 8A and 8B, the advantage of reduced gate parasitic capacitance can persist even after the fabrication of an interconnect wiring structure, providing that the first layer of interconnect dielectric 210 (typically a low-k material that may be the same or different from the sidewall spacer dielectric) can be deposited nonconformally so as to leave the air-gaps/voids 220 of the enhanced T-gate structure intact even after the interconnect wiring has been fabricated.

We have described and illustrated an enhanced T-gate structure and a method for fabricating it. The structure offers advantages in device performance, yield and scalability. While the present invention has been described in an illustrative manner, it should be understood that the terminology used is intended to be in a nature of words of description rather than of limitation.

Many modifications and variations of the present invention are possible in light of the above teachings, and could be apparent for those skilled in the art. The scope of the invention is defined by the appended claims.

We claim:

1. An enhanced T-gate comprising:
   a free T-gate, said free T-gate having a neck portion, said neck portion having a height, and a T-bar portion, said T-bar portion having overhangs extending beyond said neck portion by a first width; and
   an insulator layer disposed on each side of said neck portion, forming a sandwich structure with said neck portion along a width direction of said free T-gate, and wherein said insulator layer only partially filling up a volume defined therebetween said overhangs and a surface on which said free T-gate is standing, wherein in said sandwich structure said insulator layer having approximately a C-shape, conformally adhering to a bottom surface of said overhangs, to said neck portion, and to said surface on wich said free T-gate is standing, said insulator layer having a thickness which is less than half of said height of said neck portion, wherein said insulator layer covering said surface on which said free T-gate is standing and said bottom surface of said overhang to a distance from said neck portion substantially equal to said first width, whereby that part of said volume which is inside said C-shape is not filled by said insulator layer.

2. The enhanced T-gate of claim 1, wherein said insulator layer is a low-k material.

3. The enhanced T-gate of claim 2, wherein said low-k material is a compound of materials selected from the group consisting of SiCO, SiCOH, SiCH, these silicon containing materials with Si up to 100% replaced by Ge and these silicon containing materials further containing atoms of materials selected from the group consisting of N and F.

4. The enhanced T-gate of claim 2, wherein said low-k material is selected from the group consisting of diamond-like carbon, fluorinated amorphous carbon, insulating inorganic oxides, inorganic polymers, organic polymers, photosensitive organic materials, fluorinated organic materials, other carbon-containing materials, hybrid organo-inorganic materials and silsesquioxane-based materials.

5. A MODFET device comprising an enhanced T-gate, said enhanced T-gate further comprising:
   a free T-gate, said free T-gate having a neck portion and a T-bar portion, said T-bar portion having overhangs extending beyond said neck portion; and
   an insulator layer disposed on each side of said neck portion, forming a sandwich structure with said neck portion along a width direction of said free T-gate, and wherein said insulator layer only partially filling up a volume defined therebetween said overhangs and a surface on which said free T-gate is standing, wherein in said sandwich structure said insulator layer having approximately a C-shape, conformally adhering to a bottom surface of said overhangs, to said neck portion, and to said surface on which said free T-gate is standing, said insulator layer having a thickness which is less than half of said height of said neck portion, wherein said insulator layer covering said surface on which said free T-gate is standing and said bottom surface of said overhang to a distance from said neck portion substantially equal to said first width, whereby that part of said volume which is inside said C-shape is not filled by said insulator layer.

6. The MODFET device of claim 5, further comprising a self-aligned source/drain metallurgy, wherein a borderline of said metallurgy is defined by said insulator layer.

7. An integrated circuit comprising at least one MODFET device, said MODFET device comprising an enhanced T-gate, wherein said enhanced T-gate further comprising:
   a free T-gate, said free T-gate having a neck portion and a T-bar portion, said T-bar portion having overhangs extending beyond said neck portion;
   an insulator layer disposed on each side of said neck portion, forming a sandwich structure with said neck portion along a width direction of said free T-gate, and wherein said insulator layer only partially filling up a volume defined therebetween said overhangs and a surface on which said free T-gate is standing; and
   a multilevel interconnect structure of low-k interconnect dielectrics.

8. The integrated circuit of claim 7, wherein said at least one MODFET further comprising a self-aligned source/ drain metallurgy, wherein a borderline of said metallurgy is defined by said insulator layer.

9. The integrated circuit of claim 7, wherein said low-k interconnect dielectrics leaving voids in said volume only partially filled up by said insulator layer.

10. The integrated circuit of claim 7, wherein said low-k interconnect dielectrics are materials selected from the group consisting of SiCO, SiCOH, SiCH, these silicon containing materials with Si up to 100% replaced by Ge, diamond-like carbon, fluorinated amorphous carbon, insulating inorganic oxides, inorganic polymers and organic polymers.

* * * * *